United States Patent [19]

Taguchi et al.

[11] Patent Number: 4,994,888

[45] Date of Patent: Feb. 19, 1991

[54] MONOLITHIC SEMICONDUCTOR DEVICE HAVING CCD, BIPOLAR AND MOS STRUCTURES

[75] Inventors: Minoru Taguchi, Oomiya; Kazuo Kihara, Yokohama, both of Japan

[73] Assignee: Kabushiki Kaisha Toshiba, Kawasaki, Japan

[21] Appl. No.: 525,040

[22] Filed: May 18, 1990

[30] Foreign Application Priority Data

May 22, 1989 [JP] Japan ............................... 1-128314

[51] Int. Cl.⁵ .................. H01L 27/02; H01L 27/04; H01L 29/78
[52] U.S. Cl. ..................................... 357/43; 357/24; 357/48; 357/89
[58] Field of Search ........................... 357/24, 43, 48

[56] References Cited

U.S. PATENT DOCUMENTS

| | | | |
|---|---|---|---|
| 4,152,715 | 5/1979 | Wang | 357/24 |
| 4,314,857 | 2/1982 | Aitken | 357/24 |
| 4,799,098 | 1/1989 | Ikeda et al. | 357/48 |
| 4,859,624 | 8/1989 | Goto | 357/24 |
| 4,912,054 | 3/1990 | Tomassetti | 357/43 |

OTHER PUBLICATIONS

Russell A. Martin, "Optimized Retrograde N-Well for 1-μ CMOS Technology", IEEE Journal of Solid-State Circuits, vol. 21, Apr. 1986, pp. 286-292.

*Primary Examiner*—Gene M. Munson
*Attorney, Agent, or Firm*—Finnegan, Henderson, Farabow, Garrett and Dunner

[57] ABSTRACT

A semiconductor device comprising a semiconductor chip formed of a substrate of a first conductivity type and an epitaxial layer of the first conductivity type formed on the substrate, a charge transfer device section formed in the epitaxial layer and driven by a given clock, and a preset region of a second conductivity type formed adjacent to the charge transfer device section in the semiconductor ship. The preset region includes a first layer of the second conductivity type formed in a boundary portion between the substrate and the epitaxial layer, a second layer of the second conductivity type formed on the first layer the epitaxial layer, and a third layer of the second conductivity type formed on the second layer in the epitaxial layer to reach the surface of the substrate. The maximum value of the second conductivity type impurity concentration of the third layer is set smaller than the maximum value of the second conductivity type impurity concentration of the first layer. A bipolar transistor section is formed in the third layer.

8 Claims, 9 Drawing Sheets

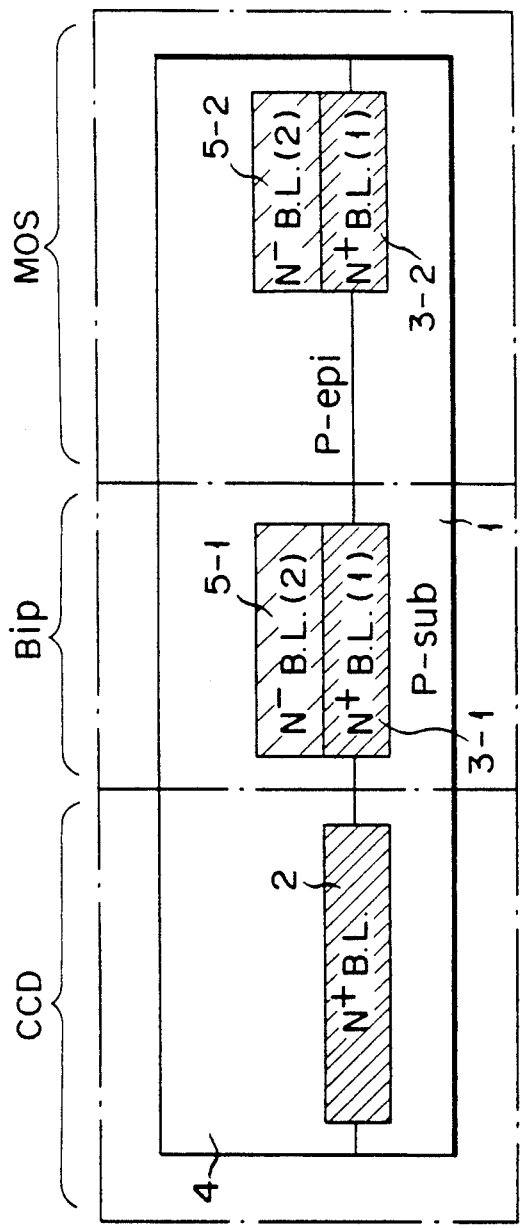
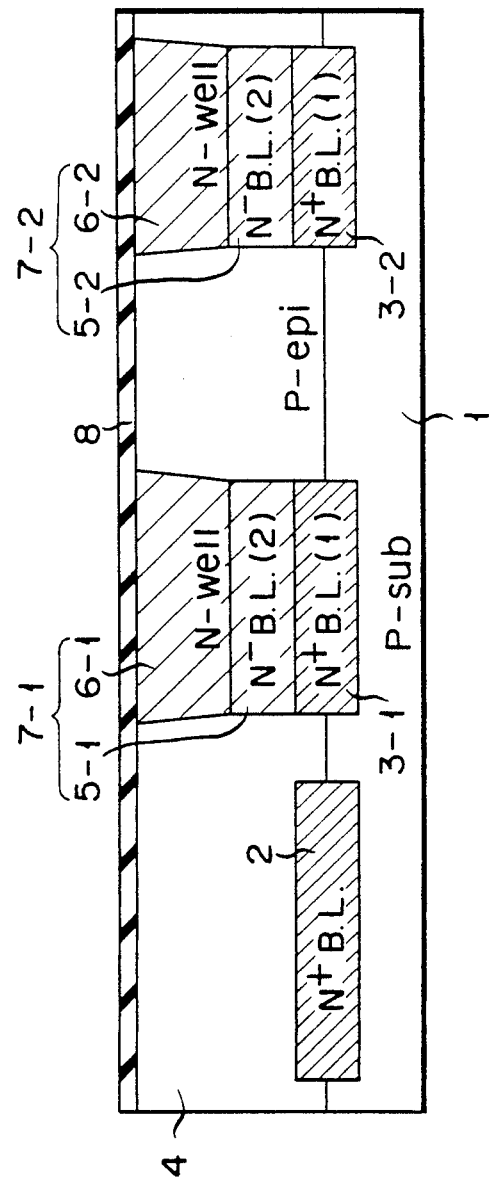
F I G. 1A
F I G. 1B

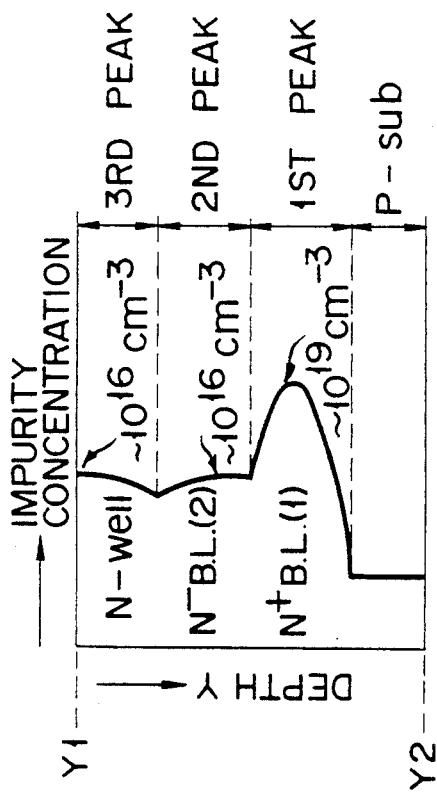
F I G. 2
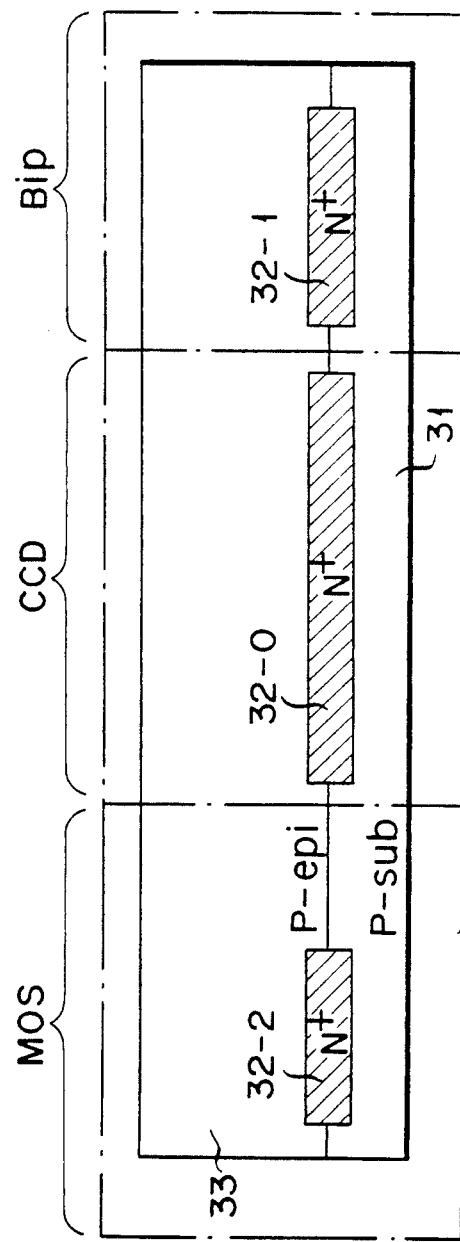
F I G. 3A

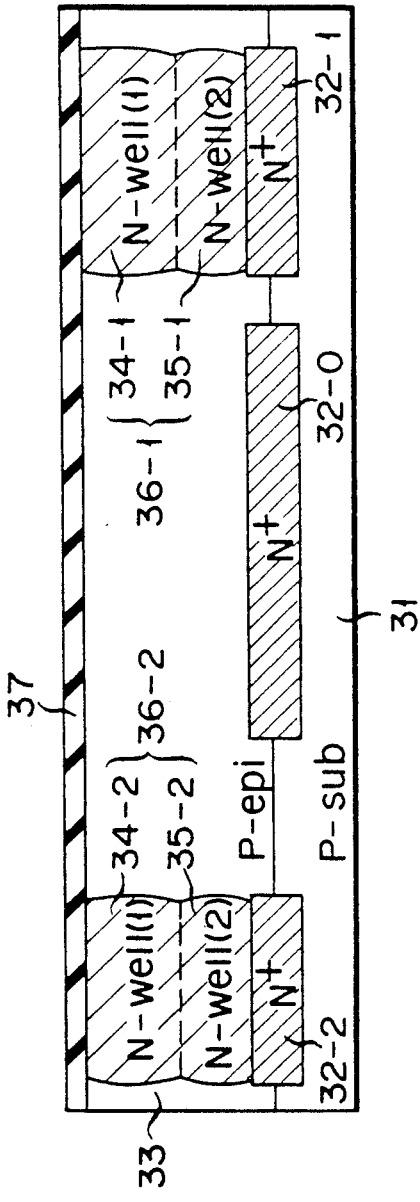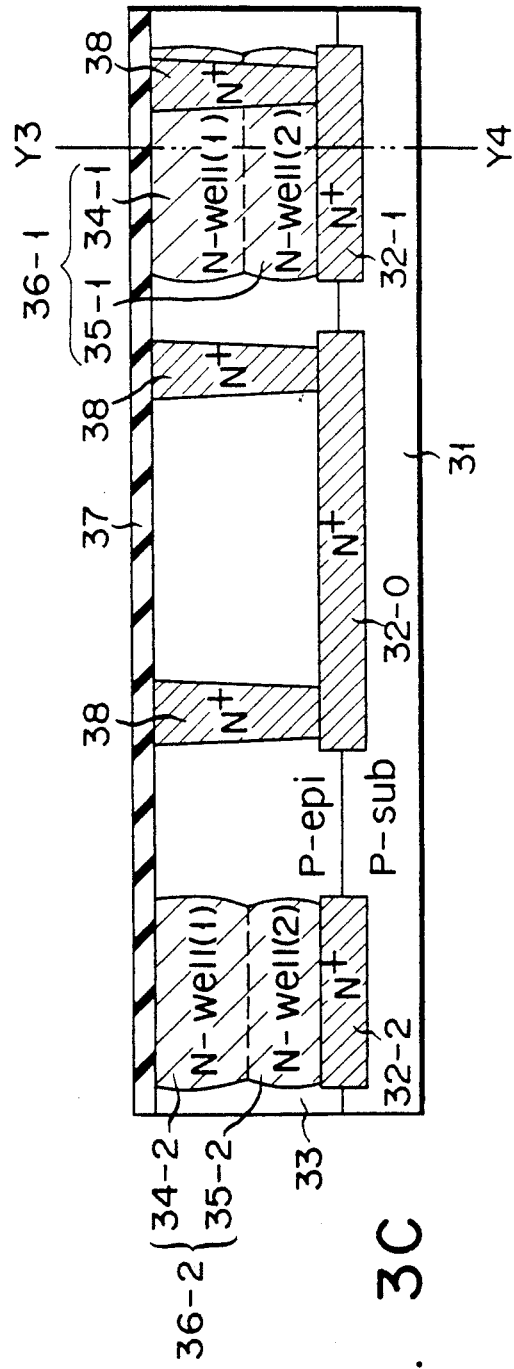
F I G. 3B
F I G. 3C

MONOLITHIC SEMICONDUCTOR DEVICE HAVING CCD, BIPOLAR AND MOS STRUCTURES

BACKGROUND OF THE INVENTION

1. Field of the Invention

This invention relates to the improvement of a semiconductor device having a charge transfer device, bipolar transistor and MOSFET formed on the same chip.

2. Description of the Related Art

Conventionally, a CCD which is a typical example of a charge transfer device is formed together with N-channel MOSFETs on one chip. Such N-channel MOSFETs formed together with the CCD constitute a CCD driving circuit, sample-hold circuit, output circuit, clock driver circuit or the like In most cases, a power source voltage for the circuits using the MOSFETs is set at 12 V or 9 V.

Recently, a tendency for MOSFETs to be formed in a CMOS configuration becomes greater as the power consumption is reduced. At the same time of forming the MOSFETs in the CMOS configuration, the power source voltage tends to be set to 5 V in order to set the power source voltage equal to that used for a bipolar IC formed in a different chip.

However, when the power source voltage is set to as low as 5 V, the linearity of the input-output characteristics of a linear amplifier (operation amplifier) constituting an output circuit and a sample-hold circuit constituted by MOSFETs will be degraded in comparison with the case of using the power source voltage of 12 V or 9 V. When the linearity of the output of the operation amplifier is degraded, the characteristic is determined to be defective at the time of testing the wafer, thereby lowering the yield.

Further, the CCD delay line only has a function of delaying a signal, and in many cases, a circuit for processing the delayed signal is formed on a bipolar IC of a different chip.

If the sample-hold circuit and the operation amplifier such as an output circuit are replaced by a bipolar transistor which has a better linearity and higher operation speed than the MOSFET at the time of low power source voltage operation, the linearity o the input-output characteristic can be improved so as to enhance the yield and attain a high performance. Further, if the bipolar IC for processing the CCD signal is formed on the same chip in a monolithic configuration, the occupied space can be reduced, the manufacturing cost can be lowered, the function can be enhanced and the system can be made simple.

However, if charges of the transfer clock for the charge transfer of the CCD leak into the base region of the bipolar transistor, the bipolar transistor section cannot be operated properly. Therefore, it has been difficult to dispose the CCD and the bipolar transistor on the same chip. This is because the bipolar transistor having a large current amplification factor ($h_{fe}$) is significantly influenced by the leaked charges of the transfer clock and the operation characteristic thereof is deteriorated so that the reliability thereof cannot be made so high as that of an acceptable device.

SUMMARY OF THE INVENTION

This invention has been made in view of the above drawbacks, and a first object of this invention is to provide a semiconductor device in which a charge transfer device and bipolar transistor can be formed on the same chip without lowering the reliability thereof.

A second object is to provide a semiconductor device having a bipolar transistor together with a charge transfer device in which variation or deterioration in the characteristic of the charge transfer device due to variation in the impurity concentration of a substrate is suppressed to enhance the reliability thereof and the withstanding voltage of the bipolar transistor is enhanced.

A third object is to improve the linearity of the input-output characteristic of a linear amplifier in a semiconductor device having a charge transfer device by constituting the linear amplifier by a bipolar transistor so as to enhance the yield of the semiconductor device having the charge transfer device and attain the high performance thereof.

A fourth object is to provide a semiconductor device having a charge transfer device in which the function of the semiconductor device having the charge transfer device can be enhanced by forming the charge transfer device and a bipolar transistor IC for processing a signal of the charge transfer device on the same chip, thus making it possible to make the whole construction of the semiconductor device simple.

A semiconductor device according to this invention having a charge transfer device and a bipolar transistor formed on the same chip has a feature that a plurality of peaks of the impurity concentration at which the impurity concentration of the substrate surface area becomes low occur in the impurity concentration profile in the depth direction of a well region in which the bipolar transistor is formed.

Additional objects and advantages of the invention will be set forth in the description which follows, and in part will be obvious from the description, or may be learned by practice of the invention The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1H are cross sectional views showing the manufacturing method in the order of the steps for manufacturing a semiconductor device having a charge transfer device according to a first embodiment of this invention;

FIG. 2 is a diagram showing the impurity concentration profile of a cross section taken along the Y-Y2 line of FIG. 1C;

FIGS. 3A to 3E are cross sectional views showing the manufacturing method in the order of the steps for manufacturing a semiconductor device having a charge transfer device according to a second embodiment of this invention;

DETAILED DESCRIPTION OF THE PREFERRED EMBODIMENTS

Figure 1C:
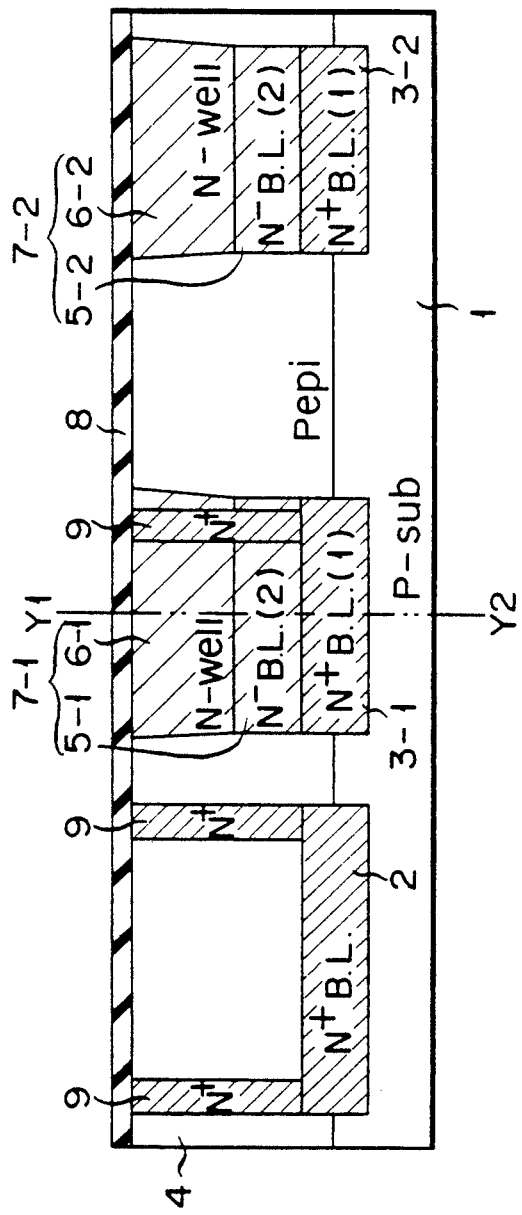

There will now be described a semiconductor device and a method for manufacturing the same according to one embodiment of this invention with reference to the accompanying drawings.

FIGS. 1A to 1H are cross sectional views showing the manufacturing method in the order of the steps for manufacturing a semiconductor device having a charge transfer device according to a first embodiment of this invention.

As shown in FIG. 1A, an oxide film (not shown) is formed on P-type semiconductor substrate 1 (P-sub) and the oxide film is patterned to form a high impurity concentration N+-type buried layer forming pattern by the photo-etching method using a photoresist, for example.

Then, the N+-type buried layer forming pattern formed of the oxide film is used as a mask, and for example, antimony (Sb) which is N-type impurity is doped by gas-phase diffusion into CCD forming area CCD, bipolar transistor forming area Bip and MOSFET forming area MOS so as to form high impurity concentration N+-type buried layers 2, 3-1 and 3-2 (N+ B.L. and N+ B.L. (1)) with the sheet resistance of approx. 20 $\Omega/\square$.

Next, a photoresist (not shown) is coated on the entire surface and openings are formed in those portions of the photoresist which lie above N+-type buried layers 3-1 and 3-2 by the photo-etching process.

Then, the thus formed photoresist is used as a mask, and phosphorus which is N-type impurity is ion-implanted into N+-type buried layers 3-1 and 3-2 in a condition that the acceleration voltage is set at 150 KeV and the dose amount is set at $3 \times 10^{13}$ cm$^{-2}$, for example. After this, the oxide film and photoresist used as the mask are removed.

Next, P-type epitaxial layer 4 (P-epi) containing boron as P-type impurity is formed with a resistivity of 20 $\Omega \cdot$cm to a thickness of approx. 4 $\mu$m on the entire surface by the epitaxial growth method, for example. At this time, phosphorus implanted into N+-type buried layers 3-1 and 3-2 and having a large diffusion coefficient is diffused into P-type epitaxial layer 4 to form low impurity concentration N−-type buried layers 5-1 and 5-2 (N+ B.L. (2)).

Next, as shown in FIG. 1B, thermal oxide film 8 is formed at a temperature of approx. 1000° C. to a thickness of approx. 500 Å on P-type epitaxial layer 4 by a thermal oxidation method, for example.

Then, a photoresist (not shown) is coated on the resultant structure and is patterned to have a preset pattern corresponding to the shape of the N-type well region by the photo-etching method.

After this, the patterned photoresist is used as a mask, and phosphorus which is N-type impurity is ion-implanted in a condition that the acceleration voltage is set at 150 KeV and the dose amount is set at $3 \times 10^{12}$ cm$^{-2}$, for example Next, the ion-implanted phosphorus is thermally diffused until it reaches N−-type buried layers 5-1 and 5-2 so as to form N-type well regions 6-1 and 6-(N-well). Substantial N-type well regions 7-1 and 7-2 of the semiconductor device are formed by combining N−-type buried layers 5-1 and 5-2 and N-type well regions 6-1 and 6-2.

Next, as shown in FIG. 1C, a photoresist (not shown) is again coated and patterned into a preset pattern of a high impurity concentration N+-type diffusion region by the photo-etching method.

Then, the patterned photoresist is used as a mask and phosphorus which is N-type impurity, for example, is ion-implanted in a condition that the acceleration voltage is set at 150 KeV and the dose amount is set at $5 \times 10^{15}$ cm$^{-2}$.

Next, the ion-implanted phosphorus is thermally diffused unit it reaches N+-type buried layers 2 and 3-1 so as to form N+-type diffusion regions 9.

N-type well regions 6-1 and 6-2 and N+-type diffusion regions may be thermally diffused at the same time. In this case, impurity for formation of N-type well regions 6-1 and 6-2 is first ion-implanted in the step shown in FIG. 1B, for example. Then, a photoresist mask is replaced by a new one and impurity for formation of N+-type diffusion regions 9 is ion-implanted. After this, the ion-implanted phosphorus ions are thermally diffused to reach N−-type buried layer 5-2 and N+-type buried layers 2 and 3-1. In the above thermal diffusion step or in a thermal diffusion step explained with reference to FIG. 1B or 1C, impurity may be thermally diffused after a CVD oxide film used as a cap for preventing out-diffusion of impurity is formed.

Figure 1D:
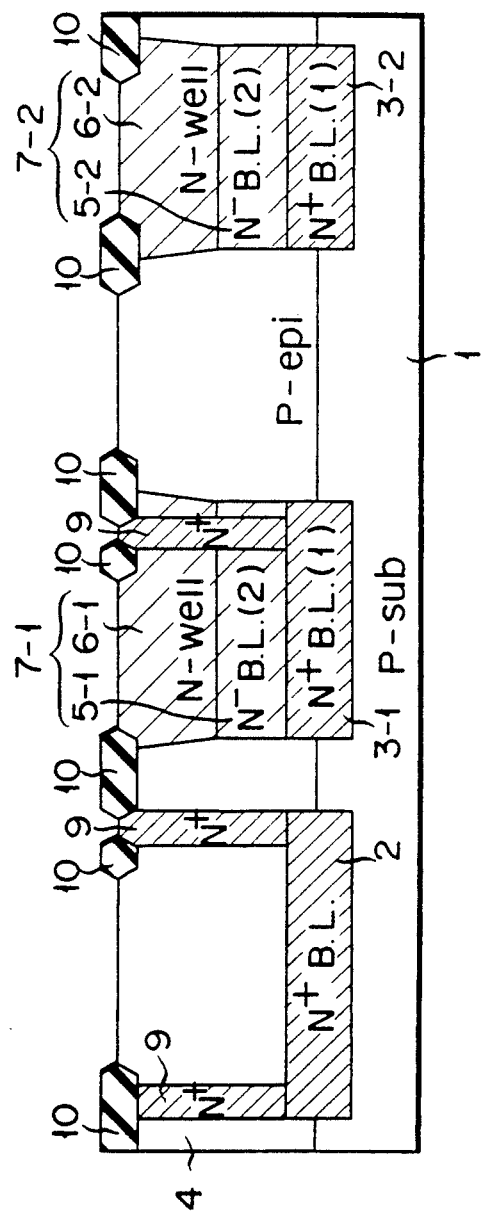

Next, as shown in FIG. 1D, thermal oxide film 8 is removed. Then, field oxide film 10 is formed as an element isolation region by the LOCOS method which is well known in the art. Further, impurity may be ion-implanted for inversion prevention into the formation area of field oxide film 10 prior to formation of field oxide film 10.

Figure 1E:
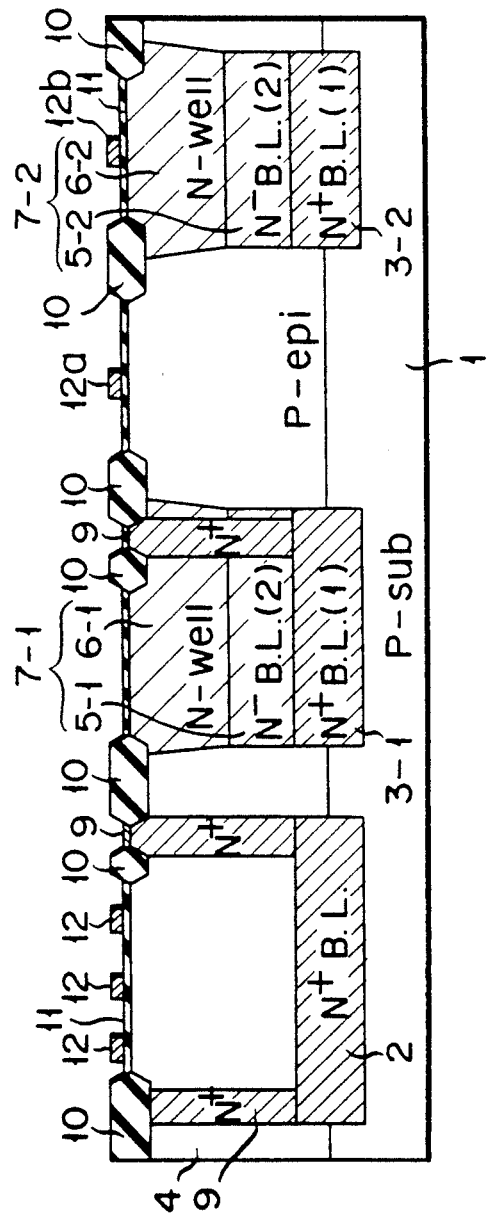

After this, as shown in FIG. 1E, first gate oxide film 11 is formed by the thermal oxidation method, for example, to a thickness of approx. 700 Å on the surface of the element regions isolated by field oxide film 10.

Next, impurity for the threshold voltage control is selectively ion-implanted into the CCD formation area and the CMOS formation area.

Then, a first-layered polysilicon layer (12) is formed to a thickness of approx. 4000 Å on the entire surface by the CVD method, for example. After this, phosphorus is doped by deposition diffusion into the first-layered polysilicon layer (12) at a temperature of 950° C. in an atmosphere of POCl$_3$ so that the first-layered polysilicon layer (12) can be changed into an N+ conductive layer.

Next, a photoresist (not shown) is coated and etched by the photo-etching process to have a pattern corresponding to the shapes of the first gate of a preset CCD and the CMOS gate.

Then, the first-layered polysilicon layer (12) is etched by the RIE process, for example, with the patterned photoresist used as a mask so as to have a pattern corresponding to the shapes of first gate 12 of the preset CCD and CMOS gates 12a and 12b.

Figure 1F:
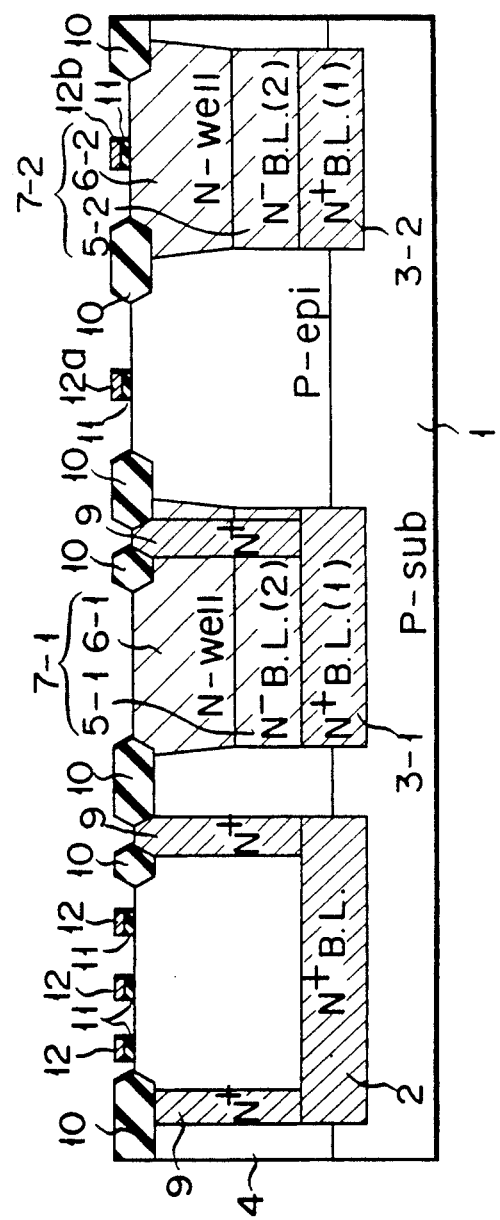

Next, as shown in FIG. 1F, first gate oxide film 1 is selectively removed by the wet etching process using ammonium fluoride, for example, with first gate 12 of the CCD and CMOS gates 12a and 12b used as a mask.

Figures 1G, 1H:
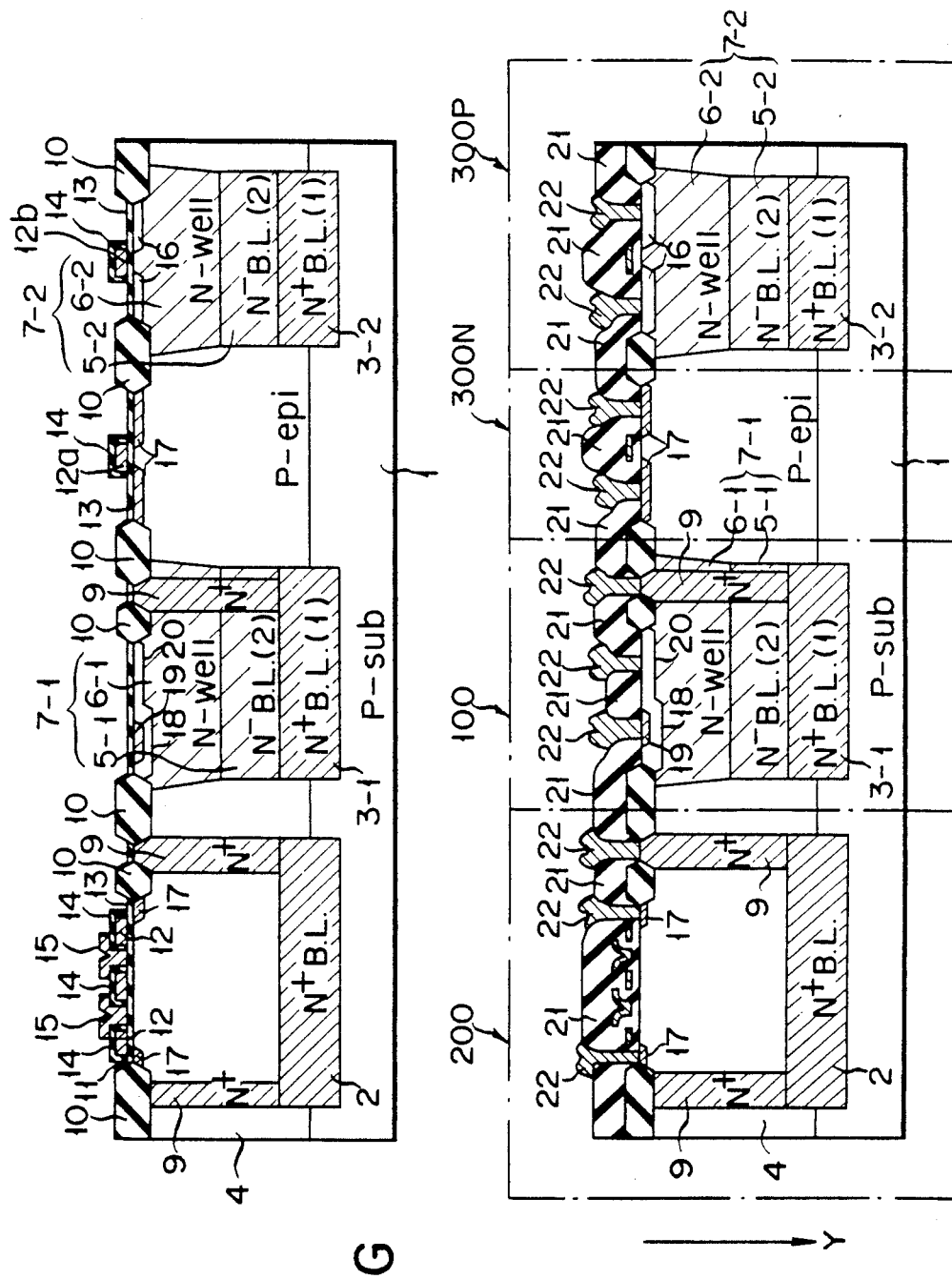

After this, as shown in FIG. 1G, second gate oxide film 13 is formed to a thickness of approx. 700 Å (which is added to the thickness of first gate oxide film 11) on the surface of the element formation area which is exposed by selectively removing first gate oxide film 11 by the thermal oxidation method, for example. At this time, the surfaces of first gate 12 of the CCD and CMOS gates 12a and 12b which are of polysilicon are also oxidized and thermal oxide films 14 are formed on the gates.

Next, boron which is P-type impurity, for example, is selectively ion-implanted into P⁻-type internal base region 18 of the bipolar transistor.

After this, a second-layered polysilicon layer (15) is formed to a thickness of approx. 4000 Å on the entire surface by the CVD method, for example. Then, phosphorus is doped into the second-layered polysilicon layer (15) by deposition diffusion at a temperature of 950° C. in an atmosphere of $POCl_3$, for example, so that the second-layered polysilicon layer (15) may be turned into an N⁻-type conductive layer.

Next, a photoresist (not shown) is coated on the resultant structure and etched into a pattern corresponding to the shape of the second gate of the preset CCD by the photo-etching process Then, the patterned photoresist is used as a mask to etch the second-layered polysilicon layer (15) into a pattern corresponding to the shape of second gate 15 of the preset CCD by the RIE method, for example.

After this, arsenic (As) which is N-type impurity, for example, is selectively ion-implanted into the CCD, N⁺-type source and drain regions 17 of the N-channel MOSFET, and N⁺-type emitter region 19 of the bipolar transistor.

Then, boron which is P-type impurity, for example, is selectively ion-implanted into P⁺-type source and drain regions 16 of the P-channel MOSFET and P⁺-type external base region 20 of the bipolar transistor.

Next, as shown in FIG. 1H, a CVD film and BPSG film are successively deposited on the entire surface by the CVD method, for example, so as to form interlayer insulation film 21 formed of these films.

After this, a heat treatment is effected to make the surface of interlayer insulation film 21 flat and effect phosphorus gettering. At this time, P⁺-type source and drain regions 16, N⁺-type source and drain regions 17, P⁻-type internal base region 18, N⁺-type emitter region 19, P⁺-type external base region 20 and the like are activated.

Next, a photoresist (not shown) is coated and etched into a preset pattern having contact holes by the photoetching process.

The patterned photoresist is used as a mask to form contact holes in preset positions of the device through interlayer insulation film 21 by the RIE method, for example.

Then, an aluminum layer (22) is formed on the entire surface including the contact holes by sputtering, for example.

Next, a photoresist (not shown) is coated and etched into a preset electrode pattern by the photoetching process.

Then, the patterned photoresist is used as a mask to etch the aluminum layer (22) into a pattern corresponding to the preset shape of electrodes 22 by the RIE method, for example.

After this, a surface protection film (not shown) is formed on the entire surface and preset wirings are formed thereon to complete the semiconductor device including the charge transfer device according to the first embodiment of this invention.

FIG. 2 shows the impurity concentration profile on the cross section taken along the Y1–Y2 line of FIG. 1C.

As shown in FIG. 2, the impurity concentration of N⁺-type buried layer 3-1 is set at approx. $10^{19}$ cm⁻³ at the first peak point thereof The impurity concentration of N⁻-type buried layer 5-1 and N-type well region 6-1 which lie on the N⁺-type buried layer is set at approx. $10^{16}$ cm⁻³ at the second and third peak points thereof.

That is, effective well region 7-1 of the semiconductor device which is formed of N⁻-type buried layer 5-1 and N-type well region 6-1 has three peaks of impurity concentration in the depth direction thereof Thus, in the semiconductor device including the charge transfer device according to this invention, three peaks of impurity concentration at which the impurity concentration of the surface portion is relatively low are present in the effective well region lying on the buried layer (3-1) in the depth direction thereof.

According to the semiconductor device including the above charge transfer device and the method for manufacturing the same, for example, phosphorus which is ion-implanted into N⁺-type buried layers 3-1 and 3-2 is diffused to form N⁻-type buried layers 5-1 and 5-2 at the time of formation of P-type epitaxial layer 4. With N⁻-type buried layers 5-1 and 5-2 thus formed, it becomes unnecessary to diffuse N-type well regions 6-1 and 6-2 to a deep position (to buried layers 3-1 and 3-2) in the succeeding step, so that time required for the thermal diffusion step for forming effective N-type well regions 7-1 and 7-2 can be shortened.

If time required for the thermal diffusion step for forming effective N-type well regions 7-1 and 7-2 is shortened, diffusion of N-type impurity from N⁺-type buried layer 2 lying directly below the CCD (charge transfer device) region can be prevented so that variation or deterioration in the characteristic of the charge transfer device due to variation in the impurity concentration of the substrate at the CCD forming area can be suppressed. As a result, a highly reliable and high performance charge transfer device in which the extension of the depletion layer can always be made constant can be provided.

Further, the charge transfer device is surrounded by N⁺-type buried layer 2 and N⁺-type diffusion regions 9 which are biased to a properly set potential, that is, it is received in a cup formed of an N⁺-type region. Therefore, even if charge transfer device section 200 and bipolar transistor section 100 are formed on the same chip, clock noise of the charge transfer device is absorbed into the N⁺-type regions (2, 9) and will not affect the operation of bipolar transistor section 100.

In this way, the charge transfer device and bipolar transistor can be formed on the same chip without lowering the reliability thereof.

Further, as shown in FIG. 2, three peaks of impurity concentration are present in the depth direction in the profile of impurity concentration of the effective well region in which the bipolar transistor is formed. That is, the impurity concentration is precisely controlled with reference to three impurity concentration levels corresponding to the first, second and third peaks. Since it is preferable to set the impurity concentration of buried layer 3-1 high, the impurity concentration at the first peak is set high ($10^{19}$ cm⁻³). Since it is preferable to set the impurity concentration of the substrate surface area in which the bipolar transistor is formed to a low impurity concentration level in order to attain a high withstanding voltage, the impurity concentration at the third peak is set low ($10^{16}$ cm⁻³). Since the impurity concentration in a portion (corresponding to the second peak) between the first and third peaks can be controlled, the impurity concentration profile shown in FIG. 2 can be freely changed. As a result, the impurity concentration of an area near the substrate surface of effective N-type well region 7-1 which is the bipolar transistor forming area can be easily set low irrespective of buried layer 3-1 whose impurity concentration is high. Therefore, the base-collector withstanding voltage of the bipolar transistor (18 to 20) can be enhanced.

Further, the withstanding voltage of the bipolar transistor can be set to a desired value by properly changing the thickness of P-type epitaxial layer 4 and the condition (such as acceleration voltage and dose amount) of ion-implanting impurity into N-type well region 6-1 and/or N+-type buried layer 3-1. Therefore, the withstanding voltage of various bipolar transistors can be set to correspond to desired LSIs.

Next, the second embodiment of this invention is explained.

FIGS. 3A to 3E are cross sectional views of a semiconductor device including a charge transfer device according to the second embodiment of this invention in the order of the manufacturing steps.

First, as shown in FIG. 3A, an oxide film (not shown) is formed on P-type semiconductor substrate 31 (P-sub), for example, and is etched into a pattern for formation of high impurity concentration N+-type buried layers by the photo-etching process using a photoresist, for example.

Next, N-type impurity such as antimony is doped by gas-phase diffusion with the patterned oxide film used as a mask to form high impurity concentration N+-type buried layers 32-0, 32-1 and 32-2 having impurity concentration of approx. $1 \times 10^{19}$ cm$^{-3}$ in CCD forming area CCD, bipolar transistor forming area Bip and MOSFET forming area MOS, respectively.

Next, P-type epitaxial layer 33 (P-epi) containing boron as P-type impurity is formed with a specific resistance of 10 to 20 Ω·cm to a thickness of approx. 3 to 5 μm on the entire surface by the CVD method, for example. At this time, the impurity concentration of P-type epitaxial layer 33 is set to an optimum value for the specification of a CCD to be formed.

Next, as shown in FIG. 3B, thermal oxide film 37 is formed by the thermal oxidation method, for example.

Then, a photoresist (not shown) is coated and etched into a preset pattern corresponding to the shape of N-type well regions by the photo-etching process.

After this, N-type impurity such as phosphorus is ion-implanted with the acceleration voltage of 100 KeV and the dose amount of $2 \times 10^{12}$ cm$^{-2}$ with the patterned photoresist used as a mask. This is the first ion-implantation step with respect to the N-type well region forming area.

Subsequently, a second ion-implantation step is effected with the impurity implanted depth set different from that of the first ion-implantation step. For example, N-type impurity such as phosphorus is ion-implanted with the acceleration voltage of 2.0 MeV and the dose amount of $2 \times 10^{12}$ cm$^{-2}$. Then, phosphorus thus ion-implanted is thermally diffused to form first N-type well regions 34-1 and 34-2 ((N-well (1)) and second N-type well regions 35-1 and 35-2 (N-well (2)). At this time, second N-type well regions 35-1 and 35-2 are thermally diffused so as to be formed in contact with N+-type buried layers 32-1 and 32-2 and first N-type well regions 34-1 and 34-2 are thermally diffused so as to be formed in contact with second N-type well regions 35-1 and 35-2, respectively. First and second N-type well regions 34-1, 34-2 and 35-1, 35-2 are combined to form effective N-type well regions 36-1 and 36-2 of the semiconductor device.

In the above step, it is possible to form the well regions while scanning (or continuously changing) the acceleration voltage of the ion-implantation device. In other words, impurity may be ion-implanted into the well region forming areas while the depth to which impurity is ion-implanted is continuously changed (that is, without fixedly determining the impurity implanting condition). Also, in this case, time for forming the well regions can be shortened.

Next, as shown in FIG. 3C, a photoresist (not shown) is coated and etched by the photo-etching process to form a high impurity concentration N+-type region pattern. Then, for example, phosphorus which is N-type impurity is ion-implanted in a condition that the acceleration voltage is set at 100 KeV and the dose amount is set at $5 \times 10^{15}$ cm$^{-2}$ with the patterned photoresist used as a mask. After this, ion-implanted phosphorus is thermally diffused to reach N+-type buried layers 32-0 and 32-1 so as to form N+-type regions 38.

Figure 3D:
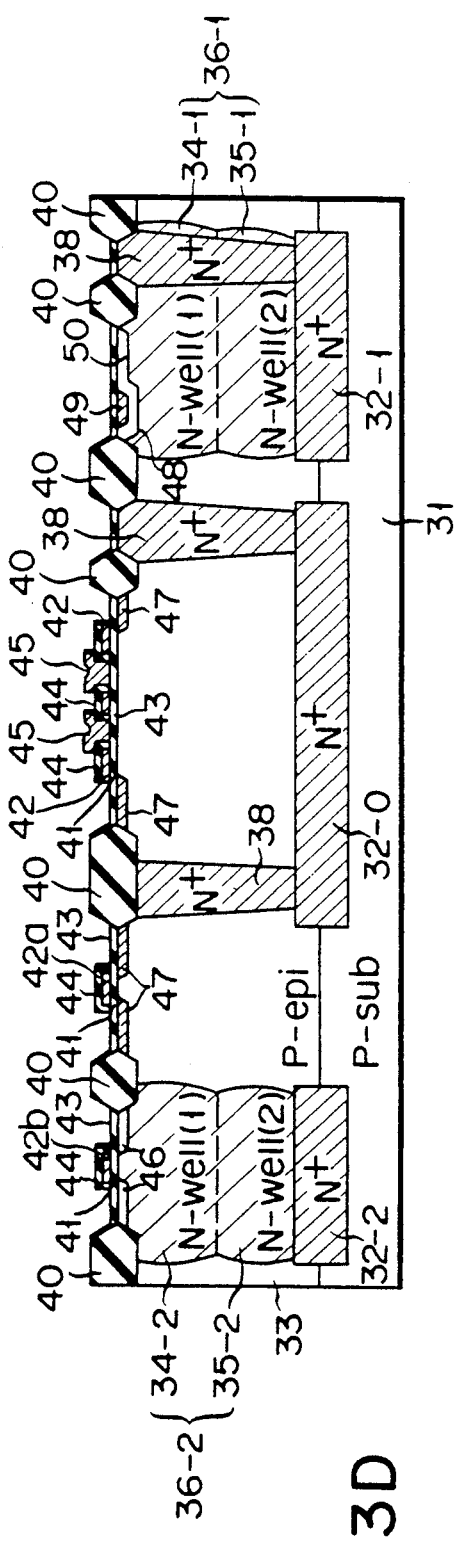

The manufacturing process effected after this is substantially the same as that of the first embodiment Next, as shown in FIG. 3D, field oxide film 40 is formed as an element isolation region. Then, first gate oxide films 41 are formed on the surface of the element regions isolated by field oxide film 40, and first gates 42 of the CCD and CMOS gate 42 are formed by using a first-layered polysilicon layer.

Next, after first gate oxide film 41 is selectively removed, second gate oxide film 43 is formed. At this time, the surface areas of first gates 42 of the CCD and CMOS gate 42 are oxidized to form thermal oxide film 44.

Then, preset P-type impurity is ion-implanted into P$^-$-type internal base region 48 of the bipolar transistor.

After this, second gates 45 of the CCD are formed by using a second-layered polysilicon layer. Then, preset N-type impurity is ion-implanted into the CCD, N+-type source and drain regions 47 of the N-channel MOSFET and N+-type emitter region 49 of the bipolar transistor.

Next, preset P-type impurity is ion-implanted into P+-type source and drain regions 46 of the P-channel MOSFET and P+-type external base region 50 of the bipolar transistor.

Figure 3E:
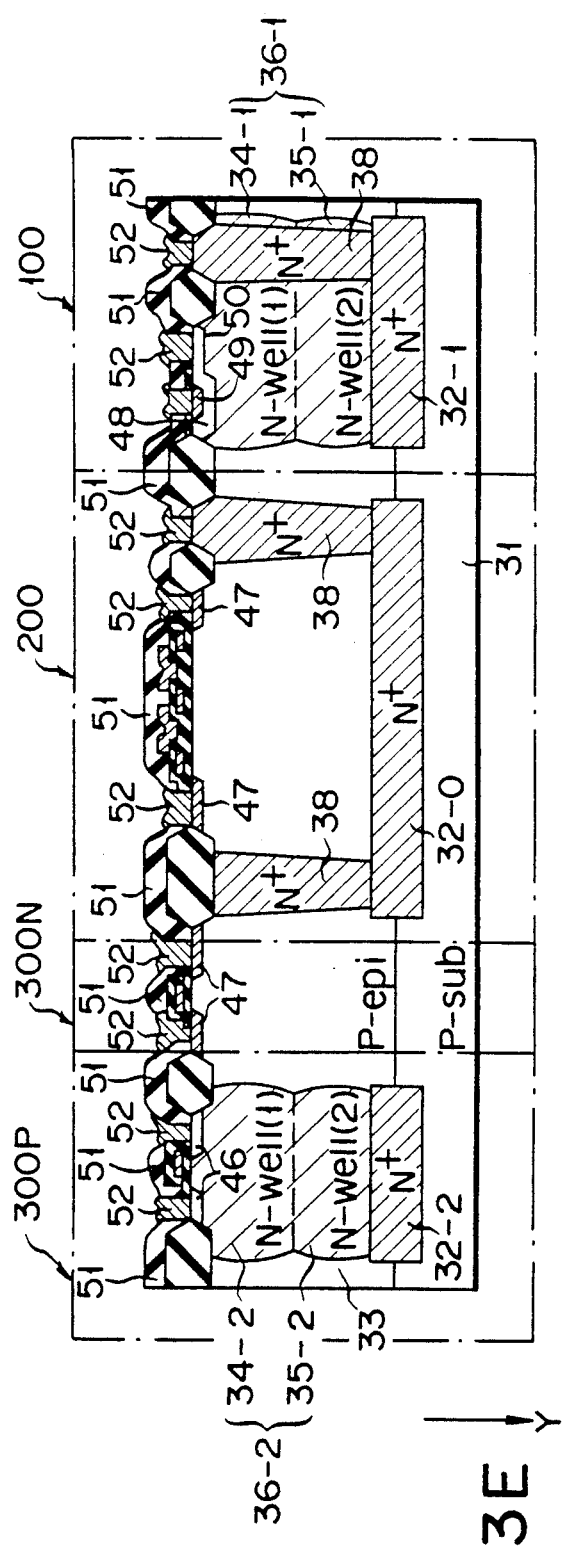

Then, as shown in FIG. 3E, interlayer insulation film 51 is formed on the entire surface, and contact holes are formed in interlayer insulation film 51 in preset positions of the device. After this, electrodes 22 of preset shape are formed by using an aluminum layer.

By the above-described process, the semiconductor device including the charge transfer device according to the second embodiment of this invention can be completed.

Figure 4:
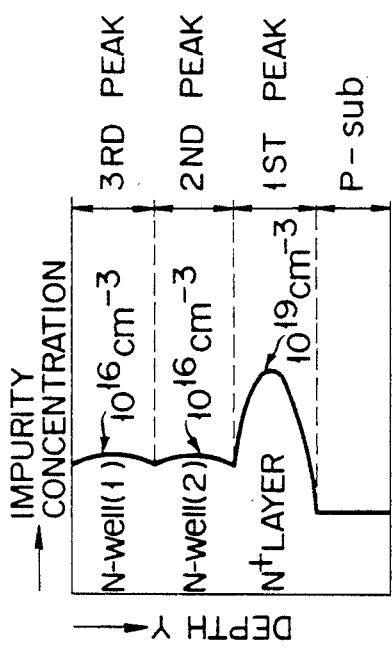
FIG. 4 is a diagram showing the impurity concentration profile of a cross section taken along the Y3-Y4 line of FIG. 3C.

FIG. 4 shows the impurity concentration profile of the cross section taken along the Y3-Y4 line of FIG. 3C.

As shown in FIG. 4, the impurity concentration of N+-type buried layer 32-1 is approx. $10^{19}$ cm$^{-3}$ at the first peak point. The impurity concentration of second N-type well region 35-1 which lies on N+-type buried layer 32-1 is approx. $10^{16}$ cm$^{-3}$ at the second peak point. Further, the impurity concentration of first N-type well region 34-1 is approx. $10^{16}$ cm$^{-3}$ at the third peak point, but is slightly higher than that of second N-type well region 35-1.

Like the first embodiment, in the second embodiment, three peaks of impurity concentration at which the impurity concentration of the substrate surface portion is relatively low are present in the effective well region 36-1 of the semiconductor device in the depth direction thereof.

According to the semiconductor device including the charge transfer device according to the second embodiment of this invention and the method for manufacturing the same, the ion-implantation process for forming the N-type well region is effected at least twice to ion-implant impurity into different portions in the depth direction. Therefore, time for effecting the thermal diffusion step for forming effective N-type well region 36-1 shown in FIGS. 3A to 3E can be shortened. As a result, like the first embodiment, variation or deterioration in the characteristic of the charge transfer device (CCD) due to variation in the impurity concentration of the substrate can be suppressed. For example, a highly reliable and high performance charge transfer device in which extension of the depletion layer can always be made constant can be formed.

Further, charge transfer device CCD is formed in a cup formed of $N^+$-type buried layer 32-0 and $N^+$-type region 38. Therefore, charge transfer device section 200 and bipolar transistor section 100 are formed on the same chip bipolar transistor section 100 will not be affected by clock noise of charge transfer device section 200 and charge transfer device section 200 and bipolar transistor section 100 are formed on the same chip without lowering the reliability thereof.

Further, like the first embodiment, three peaks of impurity concentration are present in the impurity concentration profile of the effective well region in which the bipolar transistor is formed. Therefore, it becomes possible to lower the impurity concentration of a portion near the substrate surface of effective well region 36-1 which is the bipolar transistor forming area and the withstanding voltage of the bipolar transistor can be enhanced.

Also, in the second embodiment, the withstanding voltage of the bipolar transistor can be set to a desired value by properly changing the thickness of P-type epitaxial layer 33 and the condition of ion-implanting impurity into first N-type well regions 34-1 and 34-2 and second N-type well regions 35-1 and 35-2. Therefore, the withstanding voltage of various bipolar transistors can be set to correspond to desired LSIs.

Figure 5:
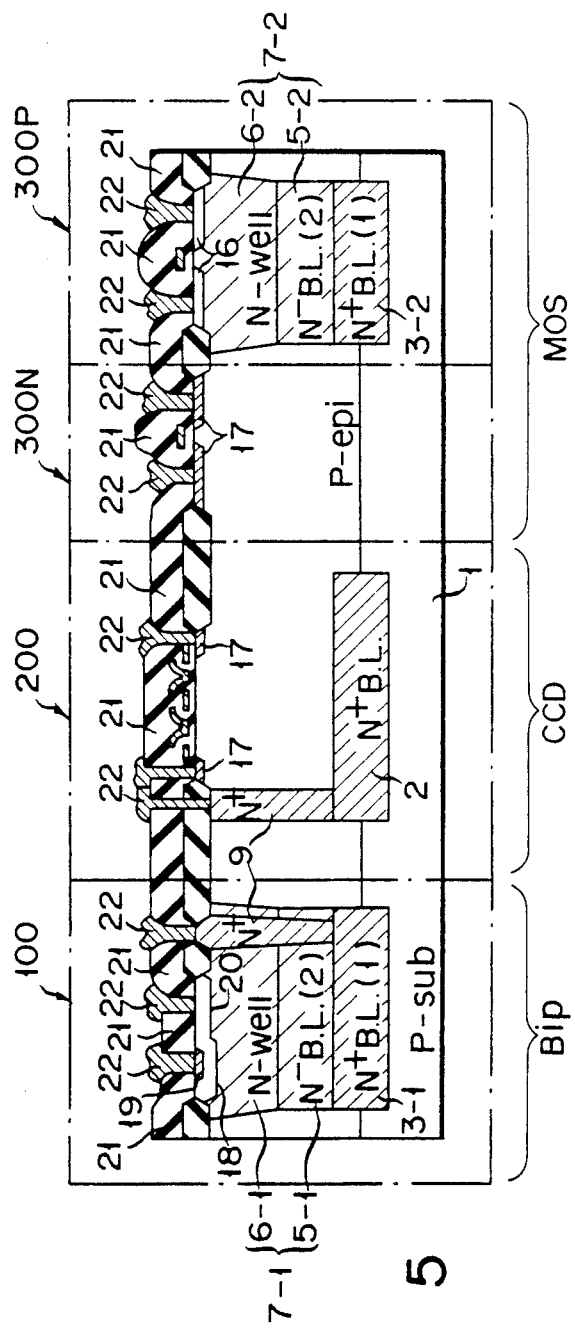
FIG. 5 shows a modification of the semiconductor device shown in FIG. 1H.

FIG. 5 shows a modification of the semiconductor structure shown in FIG. 1H. In the modification of FIG. 5, MOS transistor sections 300N and 300P are disposed on the opposite side of bipolar transistor section 100. Since MOS transistor sections 300N and 300P are hardly affected by clock leak from CCD section 200, an $N^+$wall (9) between MOS transistor section 300N and CCD section 200 is removed to enhance the IC integration density.

In the semiconductor structure of FIG. 3E, influence on bipolar transistor section 100 by the clock leak from CCD section 200 is extremely larger than that on MOS transistor section 300N. Therefore, it is preferable to increase the thickness of that portion of $N^+$ wall 38 for preventing the clock leak which lies on the side of bipolar transistor section 100.

Figure 6:
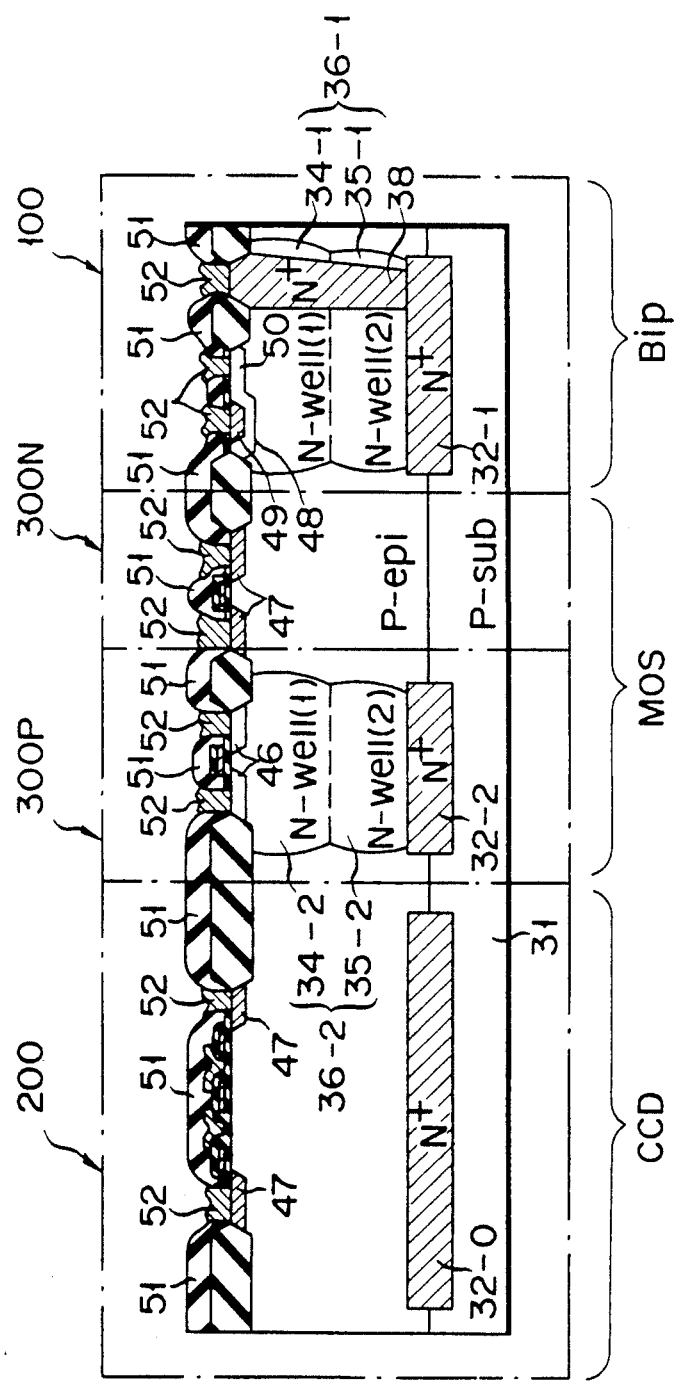
FIG. 6 is a modification of the semiconductor device shown in FIG. 3E.

FIG. 6 shows a modification of the semiconductor structure shown in FIG. 3E. In the modification of FIG. 6, MOS transistor sections 300N and 300P which are less influenced by the clock leak than bipolar transistor section 100 are disposed between CCD section 200 and bipolar transistor section 100. With this arrangement, since a distance between CCD section 200 and bipolar transistor section 100 can be set large, $N^+$ wall 38 which is formed to surround CCD section 200 and is necessary in the semiconductor structure of FIG. 3E to suppress the clock leak to bipolar transistor section 100 can be omitted. With $N^+$ wall 38 omitted, the IC integration density can be enhanced accordingly.

In the above embodiments, the conductivity types P and N can be reversed without causing any problem.

As described above, according to this invention, a highly reliable and high performance charge transfer device and a bipolar transistor having a high withstanding voltage can be formed on the same chip without lowering the reliability thereof.

If an operation amplifier (linear amplifier) in the LSI is formed of the bipolar transistor formed on the same chip, the linearity of the output thereof can be improved. In particular, even when a power source voltage of 5 V is used, the linearity is not degraded and the yield at the time of wafer test can be enhanced.

Further, since a bipolar transistor having a high withstanding voltage can be formed on the same chip, not only an IC which is operated on the power source voltage of 5 V but also an IC which is operated on a higher power source voltage, for example, the power source voltage of 12 V can be formed on the same chip, making it possible to further enhance the function.

Further, a bipolar IC such as a signal processing circuit for the charge transfer device which has been formed on a different chip in the prior art can be formed on the same chip. Therefore, the occupied space can be reduced, the manufacturing cost can be lowered, the function can be enhanced and the system can be made simple. In this case, since it is not necessary to connect different chips to each other, the yield can be enhanced and the reliability can be enhanced.

As described above, according to this invention, a charge transfer device and bipolar transistor can be formed on the same chip without lowering the reliability thereof. In a semiconductor device having a bipolar transistor together with a charge transfer device, variation or deterioration in the characteristic of the charge transfer device due to variation in the impurity concentration of a substrate can be suppressed to enhance the reliability and performance thereof, and the withstanding voltage of the bipolar transistor can be enhanced. By replacing the linear amplifier in the semiconductor device having the charge transfer device by a bipolar transistor, the linearity of the linear amplifier can be improved and the yield can be enhanced. Further, since an IC operated on a higher power source voltage can be formed on the same chip, the function can be further enhanced At this time, if a bipolar IC for processing a signal of the charge transfer device is formed on the same chip, the system can be simplified.

Additional advantages and modifications will readily occur to those skilled in the art. Therefore, the invention in its broader aspects is not limited to the specific details, representative devices, and illustrated examples shown and described herein. Accordingly, various modifications may by without departing from the spirit or scope of the general inventive concept as defined by the appended claims and their equivalents.

What is claimed is:

1. A semiconductor device including a charge transfer device, comprising a bipolar transistor section, a MOS transistor section and a charge transfer device section which are formed in the same substrate, characterized in that a first well region in which said bipolar transistor section is formed has an impurity concentration profile which has at least three peaks of variation in the concentration of the same conductivity type impurity in a depth direction thereof.

2. A semiconductor device including a charge transfer device, comprising a bipolar transistor section, a MOS transistor section and a charge transfer device section surrounded by an N-type region, wherein said bipolar transistor section, MOS transistor section and charge transfer device section are formed in the same substrate and a first well region in which said bipolar transistor section is formed has an impurity concentration profile which has at least three peaks of variation in the concentration of the same conductivity type impurity in a depth direction thereof.

3. A semiconductor device including a charge transfer device, comprising a bipolar transistor section, a MOS transistor section and a charge transfer device section which are formed in the same substrate, wherein a first well region in which said bipolar transistor section is formed and a second well region in which said MOS transistor section is formed each have an impurity concentration profile which has at least three peaks of variation in the concentration of the same conductivity type impurity in a depth direction thereof.

4. A semiconductor device comprising:
a semiconductor chip formed of a substrate of a first conductivity type and an epitaxial layer of the first conductivity type formed on said substrate;
a charge transfer device section formed in said epitaxial layer and driven by a given clock;
a preset region of a second conductivity type formed adjacent to said charge transfer device section in said semiconductor chip, said preset region including a first layer of the second conductivity type formed in a boundary portion between said substrate and said epitaxial layer, a second layer of the second conductivity type formed on said first layer in said epitaxial layer, and a third layer of the second conductivity type formed on said second layer in said epitaxial layer to reach the surface of said substrate, and the maximum value of the second conductivity type impurity concentration of said third layer being set smaller than the maximum value of the second conductivity type impurity concentration of said first layer; and
a bipolar transistor section formed in said third layer.

5. A device according to claim 4, further comprising:
means formed in that portion of said semiconductor chip which lies between said charge transfer device section and said bipolar transistor section, for preventing charges which are caused in said semiconductor chip by a clock of said charge transfer device section from being transferred into said bipolar transistor section.

6. A device according to claim 5, further comprising:
a MOS transistor section formed adjacent to said charge transfer device section in said epitaxial layer, said charge transfer device section being arranged between said bipolar transistor section and said MOS transistor section.

7. A device according to claim 4, further comprising:
a MOS transistor section formed in said epitaxial layer, said bipolar transistor section being arranged between said charge transfer device section and said MOS transistor section.

8. A semiconductor device including a charge transfer device, comprising a bipolar transistor section, a MOS transistor section and a charge transfer device section which is surrounded by an N-type region, wherein said bipolar transistor section, MOS transistor section and charge transfer device section are formed in the same substrate, and a first well region in which said bipolar transistor section is formed and a second well region in which said MOS transistor section is formed each have an impurity concentration profile which has at least two peaks of variation in the concentration of the same conductivity type impurity in a depth direction thereof.

* * * * *